(12) United States Patent
Ruzic et al.

(10) Patent No.: US 7,230,258 B2
(45) Date of Patent: Jun. 12, 2007

(54) PLASMA-BASED DEBRIS MITIGATION FOR EXTREME ULTRAVIOLET (EUV) LIGHT SOURCE

(75) Inventors: David Ruzic, Urbana, IL (US); Robert Bristol, Portland, OR (US); Bryan J. Rice, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 10/628,129

(22) Filed: Jul. 24, 2003

(65) Prior Publication Data
US 2005/0016679 A1    Jan. 27, 2005

(51) Int. Cl.
*G01J 3/10* (2006.01)
*H05G 2/00* (2006.01)
(52) U.S. Cl. ............... 250/504 R; 156/345.48; 156/345.5; 250/493.1; 250/503.1; 250/505.1; 250/515.1; 372/5; 355/30
(58) Field of Classification Search ........... 156/345.48, 156/345.5; 250/493.1, 503.1, 504 R, 505.1, 250/515.1; 372/5; 355/30; 15/1.51
See application file for complete search history.

(56) References Cited

U.S. PATENT DOCUMENTS

| | | | | |
|---|---|---|---|---|
| 4,837,794 | A | * | 6/1989 | Riordan et al. ............. 378/119 |
| 5,432,831 | A | * | 7/1995 | Nagai et al. ................. 378/44 |
| 5,533,083 | A | * | 7/1996 | Nagai et al. ................. 378/44 |
| 6,359,969 | B1 | * | 3/2002 | Shmaenok .................. 378/156 |
| 6,421,421 | B1 | * | 7/2002 | McGeoch ................... 378/119 |
| 6,665,326 | B2 | * | 12/2003 | Kusunose .................... 372/57 |
| 6,753,941 | B2 | * | 6/2004 | Visser ......................... 355/30 |
| 6,972,421 | B2 | * | 12/2005 | Melnychuk et al. .... 250/504 R |
| 2004/0219728 | A1 | * | 11/2004 | Kandaka .................... 438/200 |

\* cited by examiner

*Primary Examiner*—M. Kornakov
(74) *Attorney, Agent, or Firm*—Fish & Richardson P.C.

(57) ABSTRACT

A light source chamber in an Extreme Ultraviolet (EUV) lithography system may include a secondary plasma to ionize debris particles created by the light source and a foil trap to trap the ionize particles to avoid contamination of the collector optics in the chamber.

1 Claim, 3 Drawing Sheets

PLASMA-BASED DEBRIS MITIGATION FOR EXTREME ULTRAVIOLET (EUV) LIGHT SOURCE

BACKGROUND

Lithography is used in the fabrication of semiconductor devices. In lithography, a light-sensitive material, called a "photoresist", coats a wafer substrate, such as silicon. The photoresist may be exposed to light reflected from a mask to reproduce an image of the mask that is used to define a pattern on the wafer. When the wafer and mask are illuminated, the photoresist undergoes chemical reactions and is then developed to produce a replicated pattern of the mask on the wafer.

Extreme Ultraviolet (EUV) a promising future lithography techniques. EUV light may be produced using a small, hot plasma which will efficiently radiate at a desired wavelength, e.g., in a range of from 11 nm to 15 nm. The plasma may be created in a vacuum chamber, typically by driving a pulsed electrical discharge through the target material, or by focusing a pulsed laser beam onto the target material. The light produced by the plasma is then collected by nearby mirrors and sent downstream to the rest of the lithography tool.

The hot plasma tends to erode materials nearby, e.g., the electrodes in electric-discharge sources or components of the gas delivery system in laser-produced plasmas. The eroded material may coat the collector optics, resulting in a loss of reflectivity and reducing the amount of light available for lithography.

DETAILED DESCRIPTION

Figure 1:
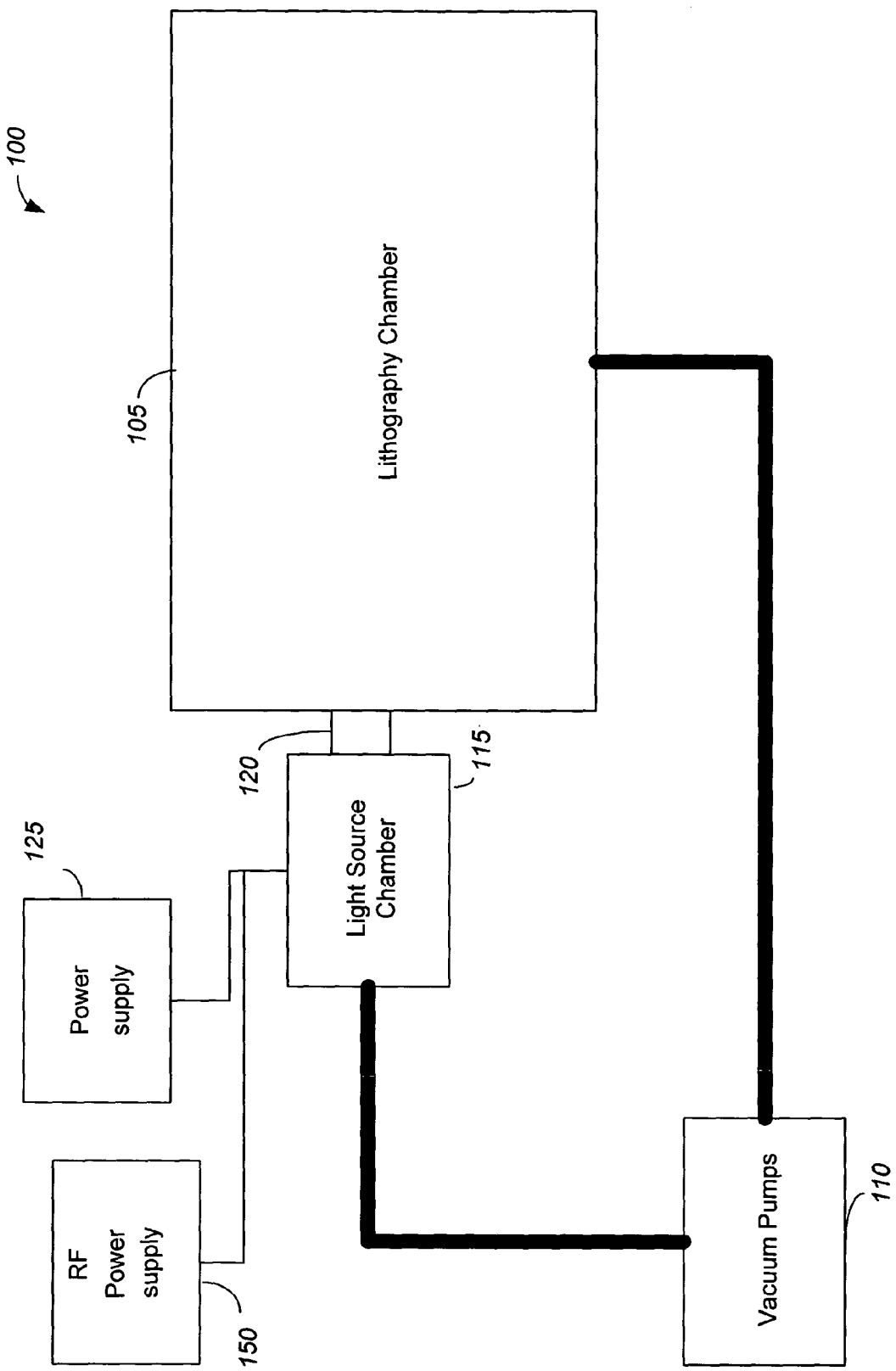
FIG. 1 shows a lithography system according to an embodiment of the invention.

FIG. 1 shows a lithography system 100. A wafer, coated with a light sensitive coating, and a mask are placed in a lithography chamber 105. The pressure in the lithography chamber may be reduced to a near vacuum environment by vacuum pumps 110. A light source chamber 115, which houses a light source, is connected to the lithography chamber 105. The pressure in the light source chamber may also be reduced to a near vacuum environment by the vacuum pumps 110. The light source chamber and lithography chamber may be separated by a valve 120 which may be used to isolate the chambers. This allows for different environments within the different chambers.

The light source chamber 115 may be an EUV chamber, which houses an EUV light source. A power supply 125 is connected to the EUV chamber to supply energy for creating an EUV photon emitting plasma, which provides EUV light for lithography. The EUV light may have a wavelength in a range of 11 nm to 15 nm, e.g., 13.5 nm. The source may be a plasma light source, e.g., a laser plasma source or a pinch plasma source. Plasma-producing components, e.g., electrodes, in the EUV source may excite a gas, e.g., Xenon, to produce EUV radiation. The EUV chamber may be evacuated by the vacuum pumps 110.

Figure 2:
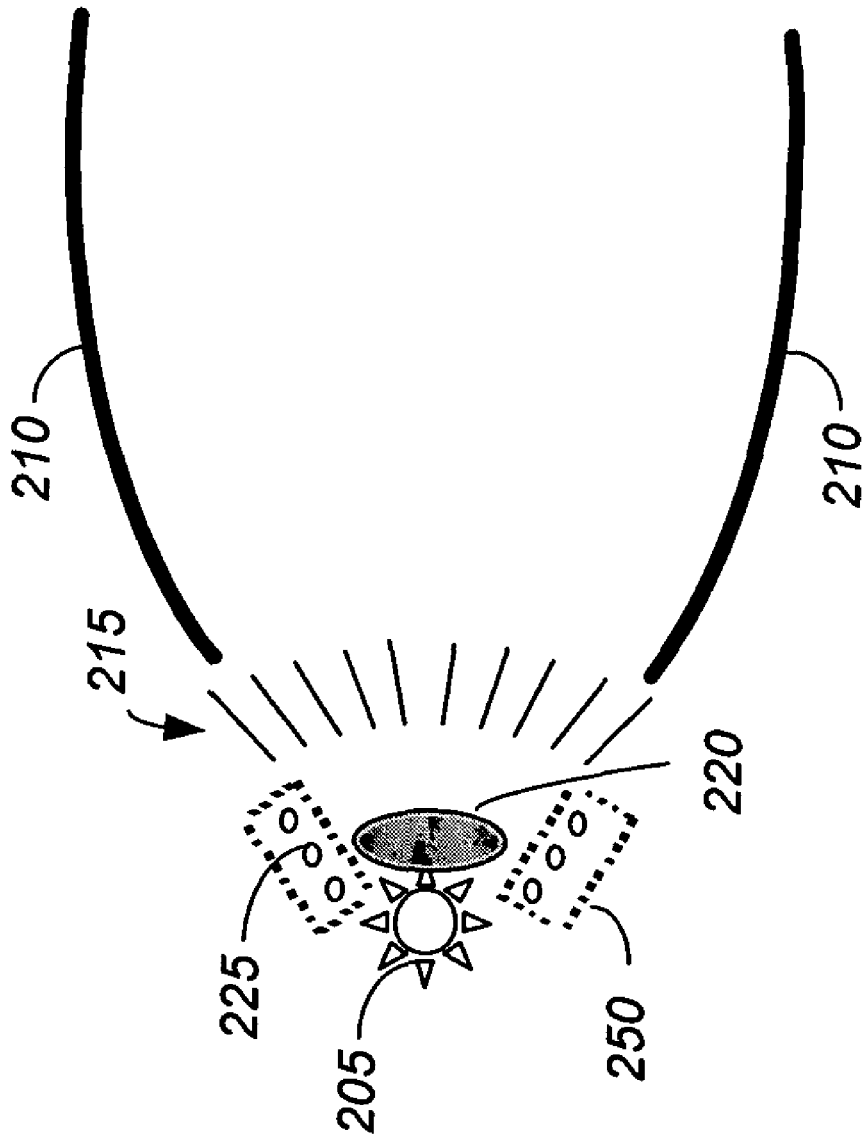
FIG. 2 shows components in a light source chamber according to an embodiment of the invention.

FIG. 2 shows components in a light source chamber according to an embodiment of the invention.

Tungsten (W) or other refractory metal or alloy of same may be used for components in the EUV source because it is relatively resistant to plasma erosion. However, plasma-erosion may still occur, and the debris produced by the erosion may be deposited on the collector mirrors 210. Debris may be produced from other sources, e.g., the walls of the chamber. Debris particles may coat the collector mirrors, resulting in a loss of reflectivity. Fast atoms produced by the electric discharge (e.g., Xe, Li, Sn, or In) may sputter away part of the collector mirror surfaces, further reducing reflectivity.

Debris-contaminant "foil traps", e.g., foil elements in a collimator-type geometry 215, may be positioned between the source 205 and the collector mirrors 210. The foil elements may be small, thin foils spaced apart from each other by, e.g., 1 mm and spaced apart from the source by, e.g., 10–20 mm. Typically, the debris particles travel in a jagged path characteristic of Brownian motion. This path makes the debris particles susceptible to striking, and being captured by, the foil traps.

In an embodiment, a relatively low-energy secondary plasma 220 may be created between the EUV source 205 and the foil traps 215. The secondary plasma may ionize debris particles and Xenon atoms. Electrical and magnetic forces may then be provided to effect the motion of the particles more strongly toward the foil traps. An electric field which produces such forces may be created by, e.g., alternating the potential of the foil traps themselves. The ionized Xenon atoms and debris particles are drawn to the foil traps. As a result, less debris reaches collector mirrors.

Typically, the gas densities in the EUV chamber are high enough that even though debris particles may be initially charged when created near the source plasma, many quickly become neutralized.

A plasma source may be used to generate the secondary plasma 220. For example, in the embodiment shown in FIG. 2, an antenna (e.g., a coil) 225, with a radio frequency (RF) power supply 150 (FIG. 1) to supply power to the coil. Other plasma sources may include, e.g., a helicon or ECR plasma source, DC glow discharge, or capacitive plate system.

The plasma source may include "Faraday shields" 250 or other means to lessen the voltage on the coil itself, thereby minimizing sputtering of the coil.

The timing to create the secondary plasma and ionize the particles may be very short, e.g., on the order of tens of microseconds. High volume manufacturing (HVM) source repetition rates may be of the order of 10 Khz, which is a period of 100 μs, with an individual pulse event lasting less than 1 μs. Thus more than 99 microseconds may be available between pulses to produce the secondary plasma. The secondary plasma may be triggered to occur between source pulses, minimizing interference with the source discharge. In some embodiments, this may not be necessary. For example, in an embodiment the secondary plasma may be left on during and between source pulses.

A pressure gradient may be established on either side of the foil trap to allow for a high gas pressure on the source side, to help stop debris, and a lower pressure on the collector side, to minimize absorption of EUV. In an embodiment, the foil trap geometry, inlet gas flow, and vacuum pumping may be chosen to optimize the post-collector pressure for the RF plasma, while still maintaining a minimal amount of EUV absorption.

In an embodiment, the coil 225 may be operated at an overall DC bias to produce an axial magnetic field. This may deflect the path of an ion or debris particle so that it travels in a generally circular or spiral path, making it more likely to strike the plates of the foil trap. This may be especially useful when operating the source in a low-pressure environment, where debris particles are less likely to be deflected by the background gas.

Figure 3:
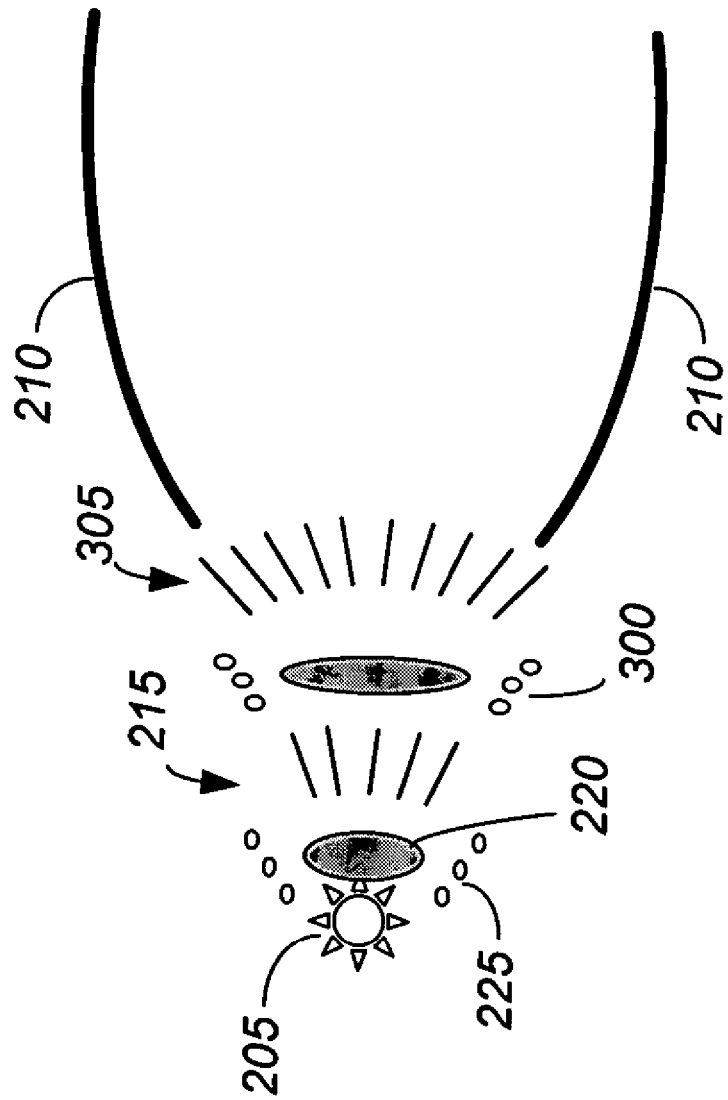
FIG. 3 shows components in a light source chamber according to an alternative embodiment of the invention.

As shown in FIG. 3, an additional (secondary) coil 300 may be positioned immediately after the foil trap to re-ionize any debris that makes it through the trap or that is re-emitted by the trap. An additional foil trap 305 may be positioned between the secondary coil 300 and the collector mirrors to trap the re-ionized and re-emitted debris.

The elements of the foil trap itself may be operated in a miniature plasma mode, either as a DC or at an RF potential driven by a power supply to produce a secondary plasma for ionizing debris particles. This would serve to both ionize particles as well as to draw them to a plate in the foil trap.

The electrode surface may be coated with a material that is easily ablated. This may assist in the cooling of the electrode, as heat energy would be carried away by the vaporization of the material. Again, alkali metal coatings, e.g., cesium, may be used.

The elements of the foil trap itself may be operated in a miniature plasma mode, either as a DC or at an RF potential to produce a secondary plasma for ionizing debris particles. This would serve to both ionize particles as well as to draw them to a plate in the foil trap.

The plasma debris mitigation technique may be applied to other uses where debris needs to be blocked from a discharge-produced plasma device, e.g., lithography using wavelengths besides EUV and other areas where a high current is driven through electrodes in a vacuum and the resultant debris needs to be blocked.

A number of embodiments have been described. Nevertheless, it will be understood that various modifications may be made without departing from the spirit and scope of the invention. For example, the ionization might be assisted by a laser pulse focused onto the region to be ionized. Accordingly, other embodiments are within the scope of the following claims.

The invention claimed is:

1. An apparatus comprising:
   a plasma produced light source;
   one or more collector optics;
   a contaminant trap between the light source and the one or more collector optics; and
   a plasma generating device to prevent matter from reaching the one or more collector optics, further comprising an electromagnetic field generating device to attract the ionized debris particles toward the contaminant trap, wherein the contaminant trap comprises a plurality of foil elements,
   a power source to produce a potential difference between neighboring metal foil elements in the contaminant trap to attract the ionized particles to the metal foils.

* * * * *